United States Patent
Wirbser et al.

[11] 4,066,204
[45] Jan. 3, 1978

[54] PROCESS AND DEVICE FOR UNSOLDERING SEMICONDUCTOR MODULES IN THE FLIP-CHIP TECHNIQUE

[75] Inventors: Oskar Wirbser, Unterpfaffenhofen; Nikolaus Ernst, Munich, both of Germany

[73] Assignee: Siemens Aktiengesellschaft, Berlin & Munich, Germany

[21] Appl. No.: 695,821

[22] Filed: June 14, 1976

[30] Foreign Application Priority Data

July 2, 1975 Germany .......................... 2529554

[51] Int. Cl.$^2$ .................... H05L 21/70; B23K 3/00
[52] U.S. Cl. ................... 228/264; 228/6 A; 228/20
[58] Field of Search ............ 228/6 A, 19, 20, 191, 228/264; 269/21; 219/230

[56] References Cited

U.S. PATENT DOCUMENTS

| | | | |
|---|---|---|---|
| 3,372,263 | 3/1968 | Lemelson | 228/6 A X |
| 3,382,564 | 5/1968 | Gallentine | 228/20 X |
| 3,434,455 | 3/1969 | Maytone | 219/230 X |
| 3,561,662 | 2/1971 | Duhaime et al. | 228/20 |
| 3,930,295 | 1/1976 | Rose | 269/21 X |

OTHER PUBLICATIONS

Drexinger "Repair of Integrated Circuits" *Technical Digest* No. 3 July 1966, Western Electric p. 11.

*Primary Examiner*—Donald G. Kelly
*Assistant Examiner*—K. J. Ramsey
*Attorney, Agent, or Firm*—Hill, Gross, Simpson, Van Santen, Steadman, Chiara & Simpson

[57] ABSTRACT

A method and device for unsoldering semiconductor modules which are soldered onto terminal surfaces of a carrier by terminal pads composed of soft solder is disclosed herein. A suction cup is placed onto a semiconductor module to be unsoldered and the terminal pads are melted. The suction cup is raised together with the semiconductor module, and, with a burst of compressed air, the semiconductor module is removed. The suction cup is then lowered onto the terminal surfaces and soft solder residues are melted and sucked away.

4 Claims, 7 Drawing Figures

PROCESS AND DEVICE FOR UNSOLDERING SEMICONDUCTOR MODULES IN THE FLIP-CHIP TECHNIQUE

BACKGROUND OF THE INVENTION

1. Field of the Invention

The invention relates to a process for unsoldering semiconductor modules in the flip-chip technique which are soldered onto the terminal surfaces of a carrier by terminal pads consisting of soft solder. The invention also relates to a device for the performance of the inventive process.

2. Description of the Prior Art

So-called multi-chip wirings are performed by soldering a plurality semiconductor modules onto the appropriate terminal surfaces of a carrier, whereupon they are subjected to an electrical function check. If the function check has a negative or undesirable result it is generally due to faulty or misassembled semiconductor modules. The carriers provided with faulty or misassembled semiconductor modules are not rejected, however, as it is considerably more economical to exchange the semiconductor modules in question.

The exchanging of modules comprises the unsoldering of the relevant semiconductor modules, the removal of the soft solder residues remaining on the terminal surfaces of the carrier, and the soldering on of another semiconductor module. Both during the unsoldering and also during the removal of the soft solder residues, a danger exists that the adjacent semiconductor modules, the terminal surfaces, or the carrier will suffer damage. Known devices for melting and withdrawing solder by suction, such as described, for example, in U.S. Pat. No. 3,822,035, cannot be used for exchanging the semiconductor modules without causing damage. This is particularly due to the small dimensions of the semiconductor modules, the high packing density, and the small spaces between the terminal surfaces.

SUMMARY OF THE INVENTION

It is an object of the present invention to provide a process for unsoldering semiconductor modules, in which it is ensured that neither during the unsoldering nor during the removal of the soft solder residues will the adjacent semiconductor modules, the terminal surfaces, or the carrier suffer damage.

In accordance with the invention, this object is realized by use of the following process. A suction cup is place onto the semiconductor module which is to be unsoldered. The terminal pads are melted, the heat required for the melting being supplied via the suction cup and the semiconductor module. The suction cup, together, with the semiconductor module, is raised and the semiconductor module is removed. The suction cup is then placed onto the terminal surfaces and the remaining soft solder residues are melted and withdrawn by suction.

The suction cup employed in the process of the invention is matched with respect to its shape and size to the dimensions of the semiconductor modules which are to be unsoldered, thus eliminating the danger of mechanical damage to the adjacent semiconductor modules. Since the suction cup is employed both for melting the terminal pads and also for lifting off the semiconductor modules and removing the liquified solder by suction, the process of the invention can be carried out economically and with a small investment in apparatus.

When melting the terminal pads the heat is purposely supplied via the suction cup and semiconductor module so that other components, particularly adjacent semiconductor modules, do not suffer thermal damage.

Preferably the semiconductor module is removed by means of an impulse of compressed air which is channelled into the suction cup. This prevents the semiconductor module from remaining stuck to the suction cup.

The invention also provides a device for performing the process of the invention. This device is characterized by a vertically displaceable or movable suction cup, a suction cup base provided with openings, and a heating device to heat the suction cup. The suction cup can be inserted into a commerically available positioning and set-down device such as is used for placing semiconductor modules down onto the carriers. This facilitates the alignment of the suction cup in relation to the semiconductor modules which are to be unsoldered without the use of additional equipment. When the suction cup is placed onto the semiconductor module which is to be unsoldered, the entire base of the cup lies on the upper side of the semiconductor module to ensure good heat transfer. When the cup is lifted, the semiconductor module abuts against the base of the suction cup, being drawn up by the partial vacuum produced in the suction cup. To enable the partial vaccum to act upon the semiconductor module and to enable the melted soft solder residues to be sucked away during the next step of the process, the base of the suction cup is provided with openings. Preferably the base is in the form of a filter having openings which are uniformly distributed. The melted soft solder residues are drawn off very rapidly and thoroughly with such a structure.

Preferably the heating device is a heating element connected to the suction cup. This ensures a good transfer of heat to the suction cup. In addition, with the aid of thermostat, the temperature of the heating element can be matched to the melting point of the soft solder being used.

In a preferred embodiment of the device in accordance with the invention, the suction cup and the base are composed of solder resistant metal. This eliminates problems caused by adhering soft solder. It has proved particularly advantageous to use chrome nickel steel which not only has solder resistant properties but also has a relatively good heat conductivity.

DESCRIPTION OF THE PREFERRED EMBODIMENTS

Figure 1:
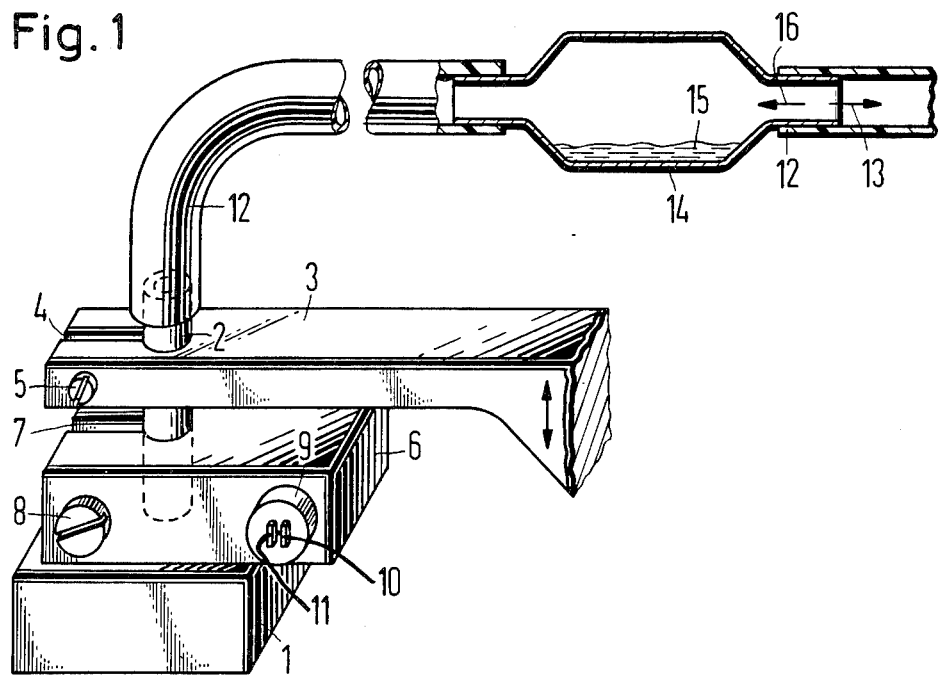
FIG. 1 illustrates a device in accordance with the invention.

FIG. 1 illustrates a device for unsoldering semiconductor modules or wafers with a suction cup 1, which secured by its shaft 2 to the carrier arm 3 of a commerically available positioning and set-down device or micro-manipulator. The shaft 2 is secured to the carrier arm 3 by means of a clamp connection, the requisite clamping being effected with the aid of a slot 4 and a screw 5. Between the suction cup 1 and the carrier arm, a heating plate 6 is secured to the shaft 2 by means of a clamp connection. The requisite clamping is effected with a slot 7 and a screw 8. The heat source is in the form of a heating element 9 which is inserted into a corresponding transverse bore in the heating plate 6, and is connected by its terminal wires 10 and 11 to a current source. To prevent the adjacent semiconductor modules or wafers and the teriminal surfaces on the carrier from suffering damage during unsoldering and suction processes, the temperature of the heating elements 9 is controlled by a thermostat. If, for example, terminal pads composed of soft solder having a high lead content and a melting point of 314° C are to be melted, the temperature occurring on the suction cup 1 is set at approximately 350° C.

The upper end of the hollow-bored shaft 2 is connected to a tube 12 which consists of a suitable synthetic material, for example polytetrafluorethylene, and is connected to the pump nozzle of a vacuum pump not shown in the drawing. The vaccum pump produces a partial vacuum of between approximately 200 and 500 mmHg, which is symbolized by the arrow 13. This partial vacuum is required both to suck away the melted soft solder and to draw away a semiconductor module. To prevent the melted soft solder from getting into the vacuum pump a solder separator 14 is connected into the tube 12. The soft solder 15 which accumulates on the base of this glass solder separator 14 must be removed from time to time. A semiconductor module adhering to the suction cup 1 can be removed by introducing a short impulse of compressed air into the tube 12, as is indicated by the arrow 16.

Figure 2:
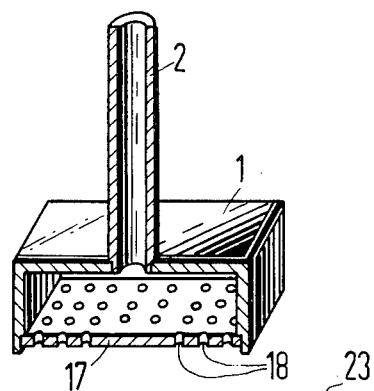
FIG. 2 illustrates a suction cup in cross-section.

FIG. 2 is a longitudinal section through the structure of suction cup 1 into which the hollow-bored shaft 2 enters from above. The lower open end of the suction cup is formed by a base 17. Numerous bores 18 are provided in the base 17, thus forming a type of filter through which liquified soft solder can sucked away. To prevent melted soft solder from adhering at any point, the suction cup 1, the shaft 2 and the base 17 consist of solder resistant chrome nickel steel. These components are joined together by hard soldering.

Figure 3:
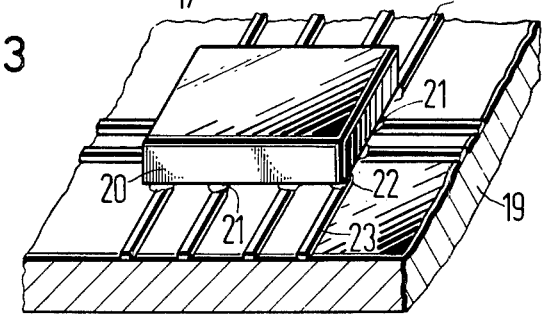
FIG. 3 is a portion of a carrier with a semiconductor module which is to be unsoldered.

FIG. 3 shows a portion of a multi-chip wiring block with a carrier 19 and a semiconductor module or wafer 20 to be unsoldered. The module 20 is soldered by its soft solder terminal pads 21 into corresponding terminal surfaces 22. The terminal surfaces 22 form the inner end regions of conductor paths 23. The individual process steps for unsoldering the semiconductor module 20 are illustrated in FIGS. 4 through 7. Here, the device of FIG. 1 is represented simply by the suction cup 1 in order to simplify the drawing.

Figure 4:
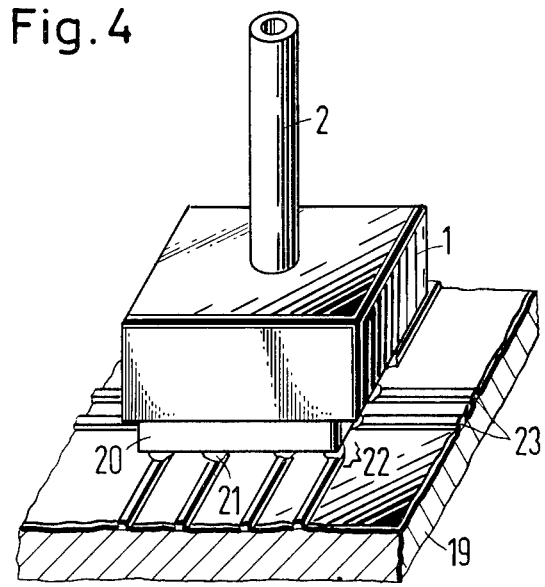
FIGS. 4 through 7 illustrate the individual process steps in the unsoldering of the semiconductor module.
Figure 5:
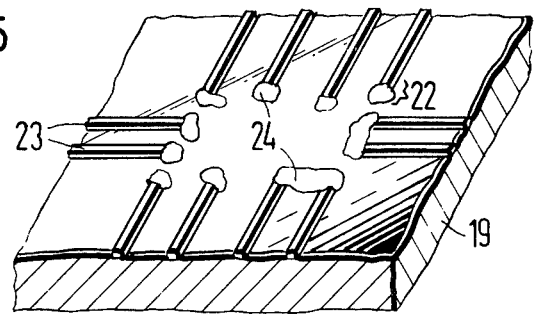

In accordance with FIG. 4, the suction cup 1 is first placed onto the semiconductor module 20 where it is left until the terminal pads 21 have melted. The heat required for melting is supplied via the suction cup 1 and the semiconductor module 20. When the terminal pads 21 have melted, the suction cup 1, together with semiconductor module 20, adhering by suction, are removed by means of an impulse of compressed air introduced into the suction cup 1. As can be seen from FIG. 5, residues 24 of soft solder remain on the carrier 19 and must be carefully removed as they can lead to breakdown, such as short-circuits when a new semiconductor module has been soldered on.

Figure 6:
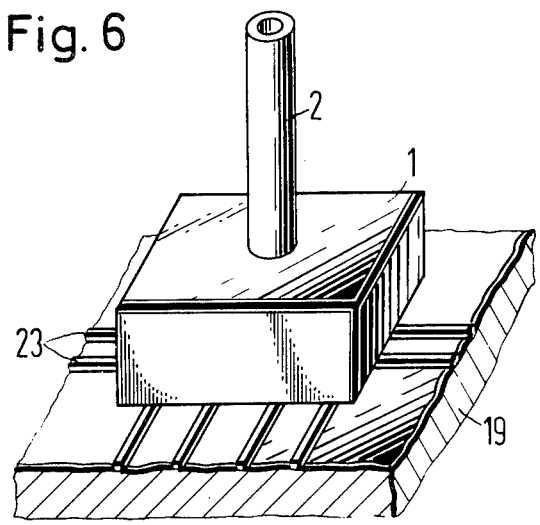
Figure 7:
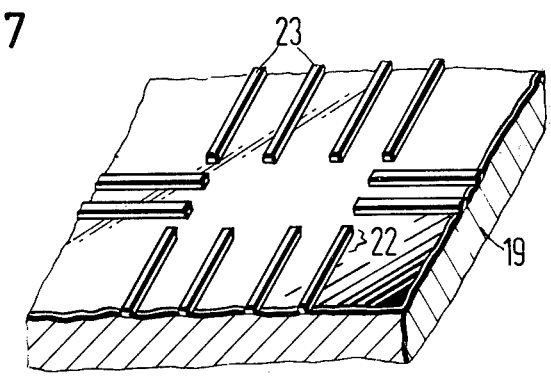

In accordance with FIG. 6, the residues 24 of soft solder are removed by placing the suction cup 1 onto the terminal surfaces 22, the outer edge resting on the conductor paths 23. The heat supplied via the suction cup 1 then melts the soft solder residues 24 so that they can then be sucked away. If necessary the melting and suction process can be repeated several times until, as illustrated in FIG. 7, all the soft solder residues 24 have been removed. The soldering on of a new semiconductor module in the flip-chip technique is then carried out in known manner by the remelting method.

Although various minor modifications may be suggested by those versed in the art, it should be understood that I wish to embody within the scope of the patent warranted hereon, all such embodiments as reasonably and properly come within the scope of my contribution to the art.

We claim as our invention:

1. A method in the flip-chip technique for unsoldering semiconductor modules which are soldered onto terminal surfaces of a carrier by terminal pads composed of soft solder, comprising the steps of:
   a. placing a suction cup with a base forming a filter onto the semiconductor module to be unsoldered such that the module is drawn against the filter when suction is applied;
   b. melting the terminal pads with heat supplied through the suction cup and the semiconductor module;
   c. raising the suction cup together with the semiconductor module;
   d. removing the semiconductor module;
   e. placing the suction cup onto the terminal surfaces; and
   f. melting and sucking away remaining soft solder residues through the filter.

2. The method of claim 1 in which the semiconductor module is removed by an impulse of compressed air channelled into the suction cup.

3. A device in the flip-chip technique for unsoldering semiconductor wafers which are soldered onto terminal surfaces of a carrier by terminal pads composed of soft solder, comprising
   a. a suction cup having a downwardly facing open end formed to closely surround one of the semiconductor wafers;
   b. a sheet-like filtering base having a plurality of aperture means for passing solder therethrough mounted within said suction cup at said open end;
   c. a vertically aligned tube connected to said suction cup;
   d. heating means connected to said suction cup;
   e. carrier means connected to said tube for vertical movement of said tube and suction cup;
   f. suction means connected to said tube; and
   g. a solder separator connected between said tube and said suction means.

4. The device of claim 3 in which a flexible tube connects between said tube and said suction means.

* * * * *